United States Patent [19]

Watanabe et al.

[11] Patent Number: 4,520,282

[45] Date of Patent: May 28, 1985

[54] ELECTRONIC IMPEDANCE CIRCUIT INCLUDING A COMPENSATION ARRANGEMENT FOR D.C. OFFSET

[75] Inventors: Kazuo Watanabe; Yuichi Ohkubo, both of Takasaki; Akira Haeno, Iruma; Fumihiko Yokogawa, Tokorozawa, all of Japan

[73] Assignees: Hitachi, Ltd.; Pioneer Electronic Corporation, both of Tokyo, Japan

[21] Appl. No.: 411,997

[22] Filed: Aug. 27, 1982

[30] Foreign Application Priority Data

Aug. 28, 1981 [JP] Japan ................... 56-134006

[51] Int. Cl.³ ..................... H03K 3/023; H03H 11/00
[52] U.S. Cl. .................... 307/491; 307/264; 307/493; 307/494
[58] Field of Search ............ 307/491, 493, 494, 264, 307/555, 297

[56] References Cited

U.S. PATENT DOCUMENTS 4,039,981 8/1977 Ohashi et al. ............. 307/493
4,066,914 1/1978 Gundry ................. 307/264
4,220,875 9/1980 Lawton ................. 307/493
4,288,707 9/1981 Katakura ............... 307/493

Primary Examiner—John Zazworsky
Attorney, Agent, or Firm—Antonelli, Terry & Wands

[57] ABSTRACT

An electronic impedance circuit is constructed of a voltage-current converter and a variable gain current amplifier. The voltage-current converter includes first and second transistors of the PNP-type differentially connected. The variable gain current amplifier includes third and fourth transistors of the NPN-type differentially connected, and fifth and sixth transistors of the PNP-type as load means. The bases of the third and fourth transistors are respectively driven by collector signals of the first and second transistors, and a collector signal of the third transistor is fed back to the base of the second transistor. In order to reduce a d.c. offset attributed to a current flowing between the base of the second transistor and the collector of the third transistor, a compensation circuit is connected to the variable gain amplifier. This compensation circuit can provide compensation by producing a compensation current for cancelling the current between the base of the second transistor and the collector of the third transistor.

7 Claims, 2 Drawing Figures

ELECTRONIC IMPEDANCE CIRCUIT INCLUDING A COMPENSATION ARRANGEMENT FOR D.C. OFFSET

BACKGROUND OF THE INVENTION

The present invention relates to a current feedback type electronic impedance circuit.

An example of a known current feedback type electronic impedance circuit is shown in the official gazette of Japanese Laid-Open Patent Application No. 52-116052 (corresponding to U.S. Pat. No. 4,220,875). This known circuit comprises a voltage-current converter which is constructed of a differential amplifier, and a variable gain current amplifier which detects the variations of the outputs of the voltage-current converter and which feeds its output signal back to the voltage-current converter. The input impedance of the electronic impedance circuit as viewed from the input terminal thereof can be varied by controlling the gain of the variable gain current amplifier.

The inventors have studied the above-described prior-art electronic impedance circuit and have determined that a drawback exists with it. Specifically, when the control current of the variable gain current amplifier for controlling the input impedance has a very small value on the order of several $\mu A$, the base current of the transistor of the voltage-current converter is no longer negligible relative to the minute control current. As a result, a d.c. offset arises in the input d.c. voltage of the voltage-current converter. When the signal of such an electronic impedance circuit in this case is amplified by a d.c. amplifier, a very great d.c. offset arises in the output of the d.c. amplifier.

SUMMARY OF THE INVENTION

The present invention has been made in view of the circumstances stated above, and has the object of providing an electronic impedance circuit with its d.c. offset reduced. To achieve this and other objects, the present invention provides a compensation circuit to compensate for the base current flow of the voltage-current converter of the electronic impedance circuit which produces the undesirable d.c. offset.

PREFERRED EMBODIMENTS OF THE INVENTION

Figure 1:
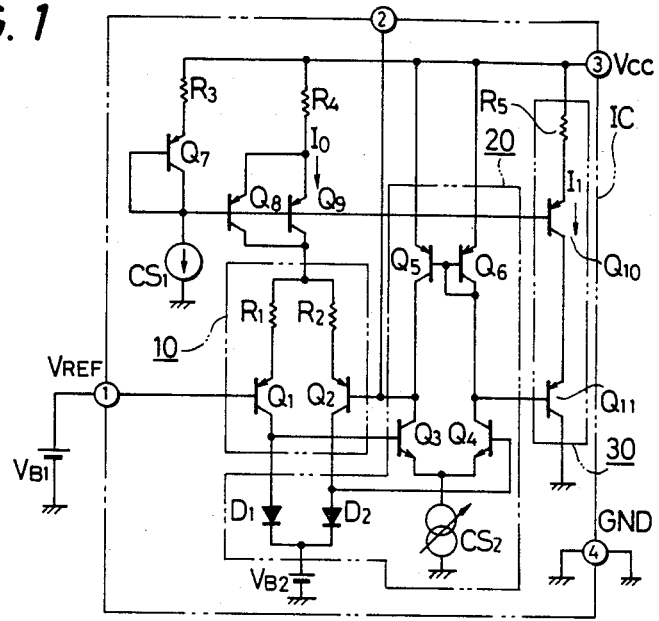
FIG. 1 shows a circuit diagram of an electronic impedance circuit according to a first embodiment of the present invention.

Now, the first embodiment of an electronic impedance circuit to which the present invention is applied will be described with reference to FIG. 1.

First, the circuit arrangement of the embodiment will be stated. Within an integrated circuit IC, a voltage-current converter 10 in the form of a differential amplifier is constucted of differential P-N-P transistors $Q_1$ and $Q_2$ and semiconductor diffused resistors $R_1$ and $R_2$. In addition, changes in the output currents of the voltage-current converter 10 are detected by diodes $D_1$ and $D_2$ constituting a variable gain current amplifier 20, and current is fed back to the base of the transistor $Q_2$ by differential N-P-N transistors $Q_3$ and $Q_4$ and load P-N-P transistors $Q_5$ and $Q_6$.

Further, a transistor $Q_7$ is provided for setting a bias voltage and transistor $Q_8$ and $Q_9$ are provided for regulating the current $I_0$ of the voltage-current converter 10. Moreover, in accordance with an important feature of the present invention, there is especially disposed a compensation circuit 30 which is constructed of transistors $Q_{10}$ and $Q_{11}$ for offset compensation. The resistances of semiconductor diffused resistors $R_4$ and $R_5$ are set, for example, at $R_5 = 2 R_4$, and the values of currents $I_0$ and $I_1$ are set at $I_0 = 2 I_1$.

The input impedance of the electronic impedance circuit as viewed from terminal No. 2 can be varied by adjusting the value of a constant current which flows through a variable constant current source $CS_2$ constituting the variable gain current amplifier 20.

The circuit operation of the electronic impedance circuit constructed as described above will now be explained.

When a supply voltage $V_{CC}$ is fed to terminal No. 3, a reference voltage $V_{REF}$ substantially equal to $\frac{1}{2} V_{CC}$ is supplied to terminal No. 1. When an input signal current is supplied to terminal No. 2, currents flowing through the collector-emitter paths of the transistors $Q_1$ and $Q_2$ vary, and the variations become variations in the forward voltages of the diodes $D_1$ and $D_2$ and are detected by the transistors $Q_3$ and $Q_4$, respectively. When currents flowing through the collector-emitter paths of the transistors $Q_3$ and $Q_4$ are consequently varied, the variations are fed back to the base of the transistor $Q_2$ through the transistors $Q_5$ and $Q_6$.

In order to render the input impedance of terminal No. 2 a high impedance (M$\Omega$), the current $I_0$ must be made in the nA or $\mu A$ range, for example, 100 $\mu A$. Assuming now that the current $I_0$ is 100 $\mu A$, a current of 50 $\mu A$ flows through each of the collector-emitter paths of the transistors $Q_1$ and $Q_2$. Owing to the common-emitter current gains h$_{fe}$ of the transistors $Q_1$ and $Q_2$ being about 20, currents of 2.5 $\mu A$ flow from the bases of the respective transistors to terminal No. 1 and the collector of the transistor $Q_3$. Accordingly, the base current of the transistor $Q_2$ which can lead to the problem described previously in regard to the prior art can be cancelled by causing a compensation current of 2.5 $\mu A$ to flow from the compensation circuit 30 to the collector of the transistor $Q_4$. This compensation circuit 30 is composed of the transistors $Q_{10}$ and $Q_{11}$ and the resistor $R_5$.

Hereunder, the compensation operation will be explained. The bias voltages of the transistors $Q_8$, $Q_9$ and $Q_{10}$ are set by a semiconductor diffused resistor $R_3$, the transistor $Q_7$ and a constant current circuit $CS_1$. The current $I_0$ is set at, for example, 100 $\mu A$ by the semiconductor diffused resistor $R_4$ and the transistors $Q_8$ and $Q_9$. Since, in this case, the resistances of the semiconductor diffused resistors $R_4$ and $R_5$ have the relationship mentioned previously, the current $I_1$ which flows through the transistors $Q_{10}$ and $Q_{11}$ of the compensation circuit 30 is set at 50 $\mu A$. Accordingly, when the common-emitter current gain h$_{fe}$ of the transistor $Q_{11}$ is made equal to that of the transistor $Q_2$, a current of 2.5 $\mu A$ flows from the base of the transistor $Q_{11}$ to the collector of the transistor $Q_4$. As a result, the base current of the transistor $Q_2$ is apparently cancelled, and the offset compensation is effected.

The circuit operation stated above is carried out in a very stable state because this circuit is constructed as an integrated circuit. More specifically, in the integrated circuit, the parameters h$_{fe}$ of the transistors, the resistances of the semiconductor diffused resistors, etc. are realized in a state free from the so-called dispersion. In addition, changes in the resistances of the semiconductor diffused resistors and changes in the parameters h$_{fe}$ of the transistors which are attributed to temperature changes vary relatively. Accordingly, the offset compensation operation as stated before can be stably performed.

Figure 2:
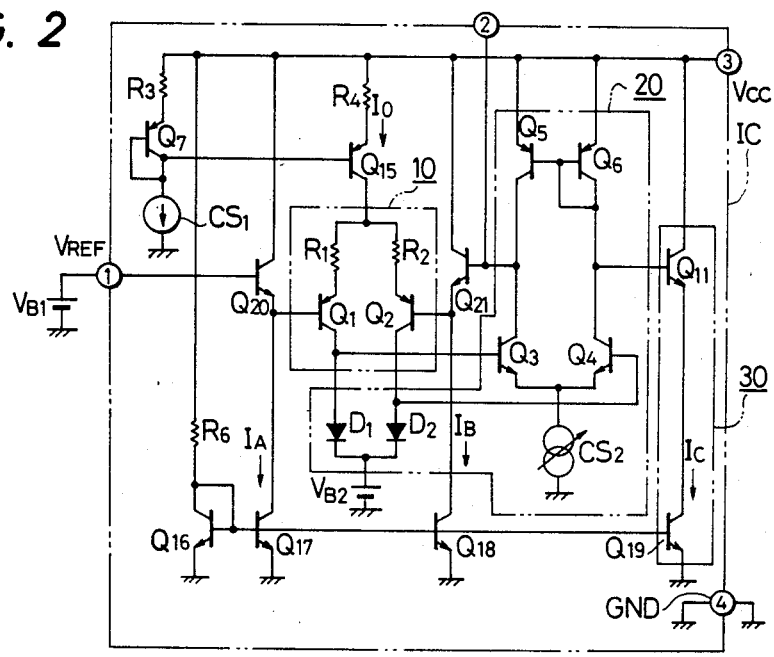
FIG. 2 shows a circuit diagram of an electronic impedance circuit according to a second embodiment of the present invention.

Now, the second embodiment of the present invention will be described with reference to FIG. 2. Portions which execute the same operations as in the first embodiment are assigned to same symbols, and will not be described.

First, the circuit arrangement will be explained. The current I$_0$ to flow through the voltage-current converter 10 is set by a transistor Q$_{15}$. The bias voltages of transistors Q$_{17}$, Q$_{18}$ and Q$_{19}$ are set by a semiconductor diffused resistor R$_6$ and a transistor Q$_{16}$. Further, the bias voltage of the transistor Q$_1$ is set by transistors Q$_{20}$ and Q$_{17}$, and that of the transistor Q$_2$ by transistors Q$_{21}$ and Q$_{18}$.

Next, the circuit operation of FIG. 2 will be explained.

When the voltage-current converter 10 and the variable gain current amplifier 20 operate as stated before, currents of, e.g., 0.5 μA flow through the collector-emitter path of the transistor Q$_3$ and that of the transistor Q$_4$ owing to the variable current source CS$_2$. Simultaneously therewith, a current I$_A$ of, e.g., 1 μA flows through the transistors Q$_{20}$ and Q$_{17}$, a current I$_B$ of, e.g., 10 μA flows through the transistors Q$_{21}$ Q$_{18}$ and a current of I$_C$ of, e.g., 10 μA flows through the transistors Q$_{11}$ and Q$_{19}$ of the compensation circuit 30. A current of 0.2 μA flows from the collector of the transistor Q$_3$ to the base of the transistor Q$_{21}$, while a current of 0.2 μA flows from the collector of the transistor Q$_4$ to the base of the transistor Q$_{11}$ of the compensation circuit 30. As a result, even when the current of the variable current source CS$_2$ is a minute one, the current of 0.2 μA flowing from the collector of the transistor Q$_3$ to the base of the transistor Q$_{21}$ can be cancelled with the current of 0.2μA flowing from the collector of the transistor Q$_4$ to the base of the transistor Q$_{11}$.

Thus, according to the present invention, it becomes possible to remarkably reduce the d.c. offset of the electronic impedance circuit.

The present invention thus far described can be subject to various modifications within the scope of the fundamental technical idea thereof. Thus, it is to be understood that the above-described arrangements are simple illustrative of the application of the principles of this invention. Numerous other arrangements may be readily devised by those skilled in the art which embody the principles of the invention and fall within its spirit and scope.

We claim:

1. An electronic impedance circuit comprising:
   a voltage-current converter which includes a first transistor and a second transistor which have their emitters differentially coupled, wherein a base of said first transistor is biased to a predetermined bias potential;
   a first constant current source which is connected to said emitters of said first transistor and said second transistor;
   a variable gain current amplifier which includes a third transistor and a fourth transistor which have their emitters differentially coupled, and which amplifier further includes a fifth transistor and a sixth transistor which have their bases connected in common, wherein a base of said third transistor and a base of said fourth transistor are respectively connected to a collector of said first transistor and a collector of said second transistor, wherein said first transistor is connected to a collector of said third transistor as a first load means, wherein said sixth transistor is connected to a collector of said fourth transistor as a second load means, and wherein said collector of said third transistor is connected to a base of said second transistor to feed a collector signal of said third transistor back to said base of said second transistor;
   a variable constant current source which is connected to said emitters of said third transistor and said fourth transistor; and
   a compensation circuit which is connected to said variable gain current amplifier to compensate a current flowing between said base of said second transistor and said collector of said third transistor, wherein said compensation circuit includes a compensation transistor whose base is connected to said collectors of said fourth and sixth transistors and which further includes a second constant current source which is connected in series with the collector-emitter path of said compensation transistor.

2. An electronic impedance circuit according to claim 1, wherein said first, second, fifth and sixth transistors are of a first conductivity type and said third and fourth transistors are of a second conductivity type.

3. An electronic impedance circuit according to claim 2, further comprising:
   a first resistor which is connected between said emitter of said first transistor and said first constant current source; and
   a second resistor which is connected betweem said emitter of said second transistor and said first constant current source.

4. An electronic impedance circuit according to claim 3, wherein said first constant current source includes a first constant current transistor of said first conductivity type.

5. An electronic impedance circuit according to claim 4, wherein said second constant current source includes a second constant current transistor of said first conductivity type which has its emitter connected to a first operating potential and its base connected to a base of said first constant current transistor, and wherein said compensation transistor is of said conductivity type and has an emitter connected to a collector of said second constant current transistor, a base connected to said collector of said fourth transistor and a collector connected to a second operating potential.

6. An electronic impedance circuit according to claim 4, wherein said compensation transistor is said second conductivity type and has a collector connected to a first operating potential and a base connected to said collector of said fourth transistor, and wherein said second current source includes a second constant current transistor which has its collector connected to an emitter of said compensation transistor, its base supplied with a predetermined bias voltage and its emitter connected to a second operating potential.

7. An electronic impedance circuit according to claim 6, further comprising:
- a seventh transistor of said second conductivity type which supplies said predetermined bias potential to said base of said first transistor through its base-emitter junction;
- a third constant current transistor of said second conductivity type which has its collector connected to an emitter of said seventh transistor, its base supplied with said predetermined bias voltage and its emitter connected to said second operating potential;
- an eighth transistor of said second conductivity type which feeds said collector signal of said third transistor back to said base of said second transistor through its base-emitter junction; and
- a fourth constant current transistor of said second conductivity type which has its collector connected to an emitter of said eighth transistor, its base supplied with said predetermined bias voltage and its emitter connected to said second operating potential.

* * * * *